United States Patent
Koh (10) Patent No.: US 7,416,937 B2
(45) Date of Patent: Aug. 26, 2008

(54) SEMICONDUCTOR DEVICE AND METHOD FOR FABRICATING THE SAME

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 205 days.

(21) Appl. No.: 11/024,757

(22) Filed: Dec. 30, 2004

(65) Prior Publication Data

US 2005/0142794 A1    Jun. 30, 2005

(30) Foreign Application Priority Data

Dec. 30, 2003  (KR)  .................. 10-2003-0100710

(51) Int. Cl.
    *H01L 21/8242* (2006.01)

(52) U.S. Cl. .................. 438/248; 438/391; 438/430

(58) Field of Classification Search ......... 438/243–244, 438/248, 386–387, 391, 430
    See application file for complete search history.

(56) References Cited

U.S. PATENT DOCUMENTS

| | | | |
|---|---|---|---|
| 4,649,625 A | 3/1987 | Lu | |
| 4,688,063 A | 8/1987 | Lu et al. | |
| 5,017,981 A | 5/1991 | Sunami et al. | |
| 5,559,350 A * | 9/1996 | Ozaki et al. | 257/304 |
| 6,297,086 B1 * | 10/2001 | Hegde et al. | 438/243 |
| 6,693,018 B2 * | 2/2004 | Kim et al. | 438/418 |
| 6,881,620 B1 * | 4/2005 | Lai et al. | 438/243 |
| 7,205,193 B2 * | 4/2007 | Koh | 438/243 |
| 7,323,379 B2 * | 1/2008 | Sinitsky et al. | 438/210 |
| 2003/0199136 A1 * | 10/2003 | Kim et al. | 438/238 |
| 2005/0139890 A1 * | 6/2005 | Koh | 257/301 |

* cited by examiner

*Primary Examiner*—M. Wilczewski
*Assistant Examiner*—Toniae M. Thomas
(74) *Attorney, Agent, or Firm*—Lowe Hauptman Ham & Berner LLP (57) ABSTRACT

A method creates semiconductor device in which a storage dielectric film and a storage electrode included in the capacitor is transferred from an inactive region of a semiconductor substrate to the active region thereof, i.e., into a device isolating trench such that the capacitor is prevented from unnecessarily occupying an active region of a semiconductor substrate while maintaining its proper function. In contrast to a conventional device where a capacitor is formed in the active region of the semiconductor substrate, to the capacitor is formed in the inactive region according to this process. Accordingly, the capacitor is able to maintain a trench structure without needing to perform a step of removal of a step height difference, and the active region is minimized in size. Therefore, without having a problem of a step height increase, a finished semiconductor device is able to accommodate modern demands for increased device interpretation.

13 Claims, 11 Drawing Sheets

SEMICONDUCTOR DEVICE AND METHOD FOR FABRICATING THE SAME

BACKGROUND OF THE INVENTION

1. Field of the Invention

The present invention relates to a semiconductor device and a method for fabricating the same, and more particularly, to a semiconductor device in which a storage dielectric film and a storage electrode included in the capacitor is transferred from an inactive region of a semiconductor substrate to the active region thereof, i.e., into a device isolating trench such that the capacitor is prevented from unnecessarily occupying an active region of a semiconductor substrate while maintaining its proper function, and a method for fabricating the same.

2. Discussion of the Related Art

Recently, the level of integration of a semiconductor device has rapidly progressed, a geometrical structure of each structural element of the semiconductor device has also been greatly reduced.

Figure 1:
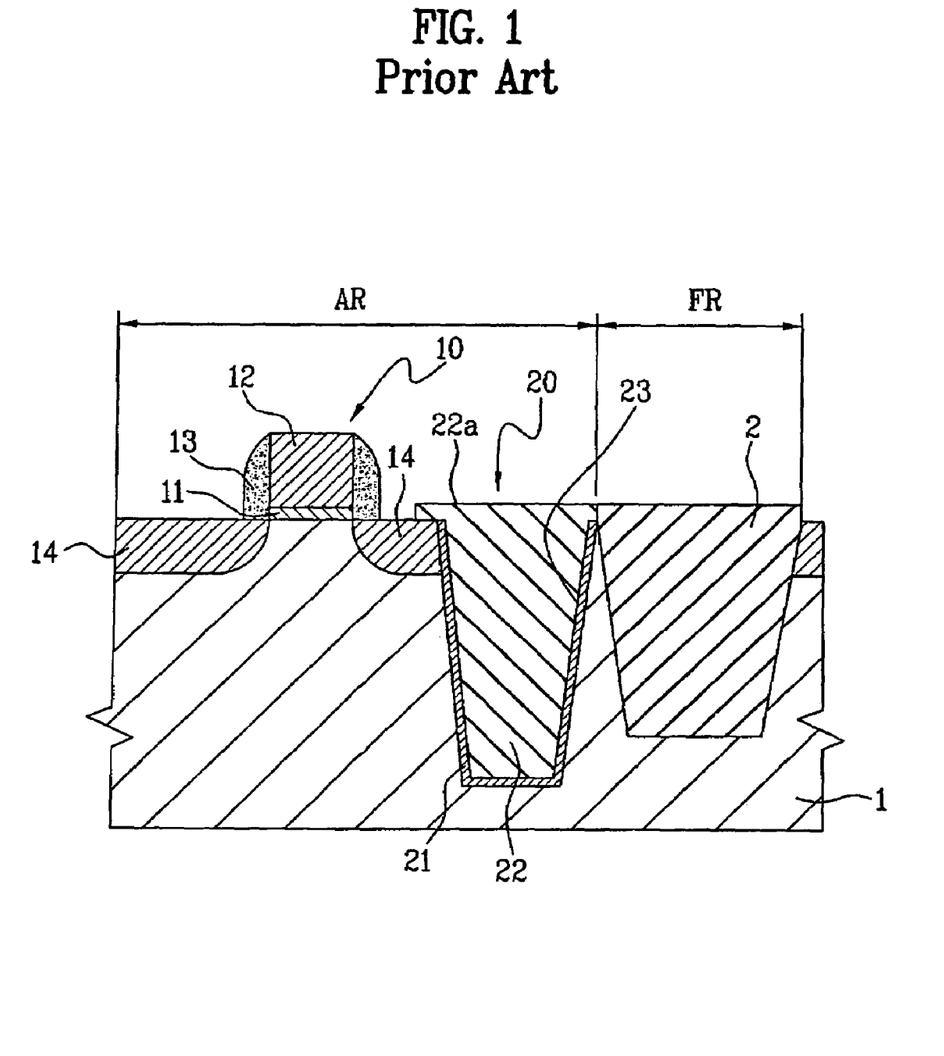
FIG. 1 illustrates a cross-sectional view showing a semiconductor device in accordance with a related art.

As illustrated in FIG. 1, in a semiconductor device in accordance with a related art, a semiconductor substrate 1 is divided and defined as an inactive region (FR) and an active region (AR) by a device separating film 2. In this case, in the active region (AR) of the semiconductor substrate 1, a transistor 10 for selectively switching a flow of electric charge, and a capacitor 20 for storing the electric charge switched by the transistor 10 are closely connected with each other.

In this case, the transistor 10 includes a gate insulating film pattern 11, a gate electrode patter 12, and a source/drain diffusion layer 14. The capacitor 20 includes a storage dielectric film 21 and a storage electrode 22.

In this case, the storage dielectric film 21 and the storage electrode 22 included in the capacitor 20 are formed in a trench 23 buried in the semiconductor substrate 1. In this instance, a portion 22a of the storage electrode 22 is exposed on a surface of the semiconductor substrate 1 and electrically connected with the source/drain diffusion layer 14 of the transistor 10.

As recognized by the present inventor, as semiconductor devices have become more highly integrated, a problem of reducing the active region (AR) acts as an important factor in determining a quality of a finished semiconductor device.

Nevertheless, as aforementioned, since the conventional capacitor 20 includes a trench structure and additionally occupies a portion of the active region (AR), if no separate measures are taken, the size of the active region (AR) of the semiconductor device largely increases as much as that of an occupied region of the capacitor 20. Therefore, it becomes more difficult to reduce the active region (AR) of the semiconductor device in accordance with the related art.

Of course, the size increase problem of the active region (AR) is somewhat assuaged when the structure of the capacitor 20 is changed from the abovementioned trench type structure to a stack type structure. However, as recognized by the present inventor in this case, a serious problem additionally occurs that an overall step height of the semiconductor device is unnecessarily increased as much as a height of the stacked capacitor 20.

SUMMARY OF THE INVENTION

Accordingly, the present invention is directed to a semiconductor device and a method for fabricating the same that substantially obviates the above-identified and other problems of conventional devices attributable to limitations and disadvantages of the related art.

An object of the present invention is to provide a semiconductor device in which a storage dielectric film and a storage electrode included in the capacitor is transferred from an active region of a semiconductor substrate to the inactive region thereof, i.e., into a device isolating trench such that the capacitor is prevented from unnecessarily occupying an active region of a semiconductor substrate while maintaining its proper function and a method for fabricating the same.

Another object of the present invention is to provide a capacitor that is able to maintain a trench structure without having to address the removal of a step height difference, and the active region is minimized in size. Therefore, without having a problem of a step height increase, a finished semiconductor device is able support to high device integration.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a trench formed by etching an inactive region of a semiconductor substrate to a predetermined depth, the semiconductor device being divided into an active region and an inactive region; a storage dielectric film filled in a lower space of the trench; a storage electrode being in contact with the active region of the trench and having a portion buried in the storage dielectric film; a device separating film filled in the rest space of the trench; and a transistor electrically connected with the storage electrode via an etch surface on the side of the active region in the trench and occupying the active region of the semiconductor substrate.

In another aspect of the present invention, a method for fabricating a semiconductor device, includes the steps of forming a trench having a predetermined depth by etching an inactive region of the semiconductor substrate divided into an active region and the inactive region; forming a first storage electrode pattern on a bottom surface of the trench; filling in a lower space of the trench with a storage dielectric film such that a surface of the first storage electrode pattern is exposed; forming a second electrode pattern at an upper part of the storage dielectric film and the first storage electrode pattern, the second electrode pattern covering an etch surface on the active region side of the trench and being electrically connected with the transistor; filling in the rest space of the trench with a device separating film; and forming a transistor in the active region of the semiconductor substrate so as to be electrically connected with the second storage electrode pattern via the etch surface on the side of the active region of the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 2:
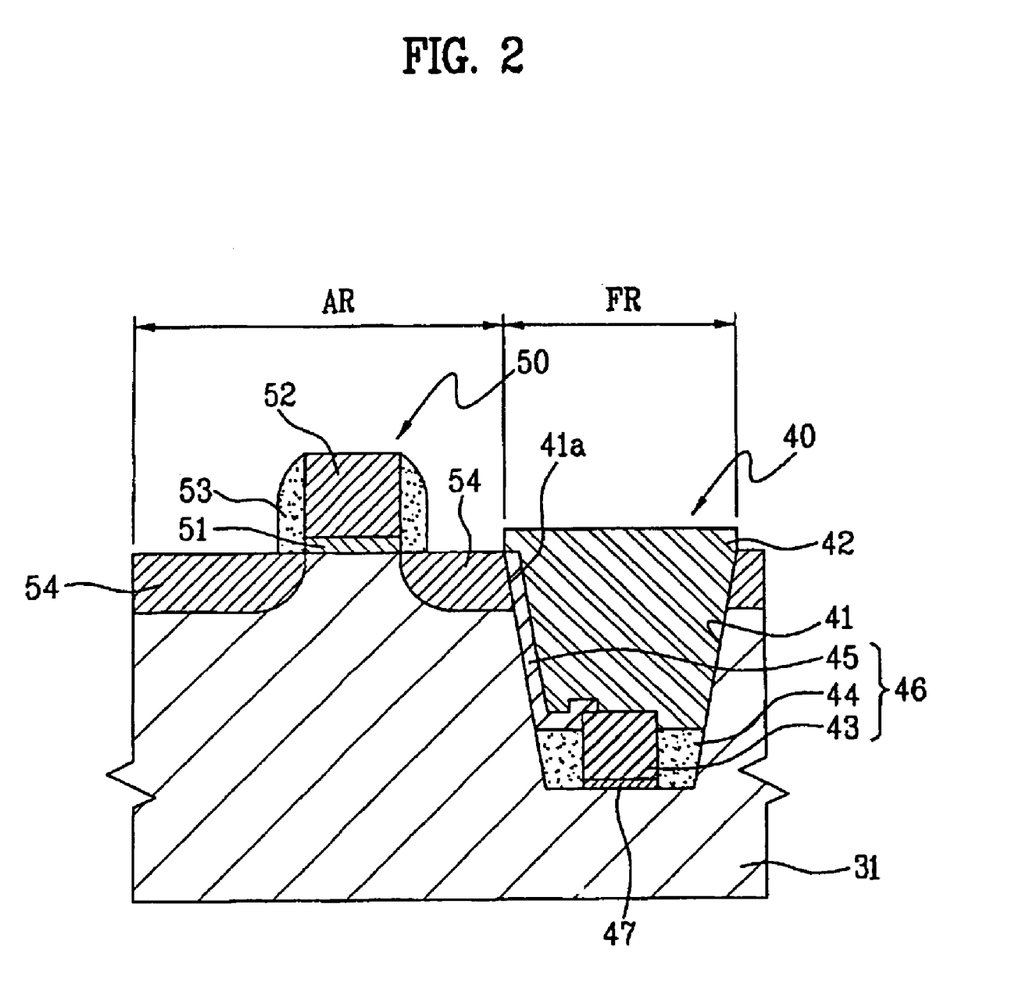
FIG. 2 illustrates a cross-sectional view showing a semiconductor device in accordance with the present invention.

Hereinafter, referring to the appended drawings, a semiconductor device and a method for fabricating the same will be described in more detail. As illustrated in FIG. 2, in the structure of the semiconductor device in accordance with the present invention, a semiconductor substrate 31 is divided and defined as an inactive region (FR) and an active region (AR) by a device separator 40. In this case, in the active region (AR) of the semiconductor substrate 31, a transistor 50 is disposed for selectively switching a flow of an electric charge to and from a capacitor 46, which holds a charge corresponding to a "1" or a "0". The transistor 50 includes a gate insulating film pattern 51, a gate electrode pattern 52, a spacer 53, and a source/drain diffusion layer 54.

In this instance, as illustrated in the drawing, the device separator 40 disposed in the inactive region (FR) of the semiconductor substrate 31 includes a trench 41 formed by etching the semiconductor substrate 31 to a predetermined depth, a capacitor 46 disposed in a portion of an interior space of the trench 41, and a device separating film 42 for separating the device shown in FIG. 2 from other devices. In other words, in the structure of the present invention, the device separator 40 has a structure that transfers the capacitor 46 from the active region (AR) of the semiconductor substrate 31 to the inactive region (FR) thereof.

In this case, the size of the active region (AR) of the semiconductor substrate 31 is decreased compared to a region from which the capacitor 46 is removed.

In the structure of the related art, since the capacitor includes a trench type structure and additionally occupies a portion of the active region, unless separate measures are taken, the size of the active region of the semiconductor substrate is largely increased as much as that of an occupied region of the capacitor. Therefore, in the related art, it is very difficult to reduce the active region (AR) of the semiconductor device.

As aforementioned, the capacitor formed in the active region (AR) of the semiconductor substrate 31 in the related art is however formed in the inactive region (FR), i.e., in the device isolating trench 41 in the structure of the present invention. Accordingly, when the present invention is embodied, the size of the active region (AR) of the semiconductor substrate 31 is substantially reduced. Therefore, a finished semiconductor device is able to support the increased integration demands in recent years.

In this case, the capacitor 46 is buried in the device isolating trench 41 and has a series of trench type structures.

Accordingly, in the structure of the present invention, the finished semiconductor device can maintain the active region (AR) in a minimum size while avoiding a damage caused from a step height increase.

In this instance, as illustrated in FIG. 2, the capacitor 46 includes a storage insulating film 44 for filing in a lower space of the trench 41, and storage electrodes 43 and 45 having a portion being buried in a storage dielectric film 44 and being in contact with an etch surface 41a on the side of the active region of the trench 41. In this case, it is desirable that the storage electrodes 43 and 45 are made of poly silicon.

In this case, the storage electrodes 43 and 45 are provided on a bottom surface of the trench 41 and include a first storage electrode pattern 43 buried in the storage dielectric film 44 and having a surface being exposed, and a second storage electrode pattern 45 placed on top of the storage dielectric film 44 and the first storage electrode pattern 43 and covering the etch surface 41a on the side of the active region of the trench 41 and being electrically connected with the transistor, e.g., the source/drain diffusion layer 54 of the transistor. Therefore, even when the capacitor 46 is transferred from the active region (AR) of the semiconductor substrate 31 to the inactive region (FR) of the semiconductor substrate 31, the capacitor 31 can perform its proper function, i.e., a function of storing an electric charge.

Alternatively, the capacitor can be placed in a mid region, or even an upper portion of the device isolation trench. Likewise, the capacitor in one memory cell can be formed in the bottom of its associated device isolation trench and an adjacent capacitor from adjacent memory cells be formed in the mid or upper section of their device isolation trenches. When arranged in this manner, the distance between capacitors increases, thereby reducing capacitive coupling and leakage effects.

In embodying the present invention, similar to the semiconductor substrate 31 including the bottom surface of the trench 41, the first storage electrode pattern 43 includes poly silicon. Accordingly, unless separate measures are taken, it is difficult to precisely set an etch termination point of the first storage electrode pattern 43, thereby raising a problem that it is difficult to normally form the first storage electrode pattern 43.

In the present invention, in consideration of the problem above-mentioned, as illustrated in the drawing, an etch termination discriminating layer 47 is additionally provided at a lower part of the first storage electrode pattern 43, the etch termination discriminating layer 47 having a material different from the first storage electrode pattern 43, for example an oxidation material. Due to the etch termination discriminating layer 47, during the fabrication of the first storage electrode pattern 43, the etch termination point is easily discriminated, thus the formation of the first storage electrode pattern 43 is more easily carried out.

Figure 3A:
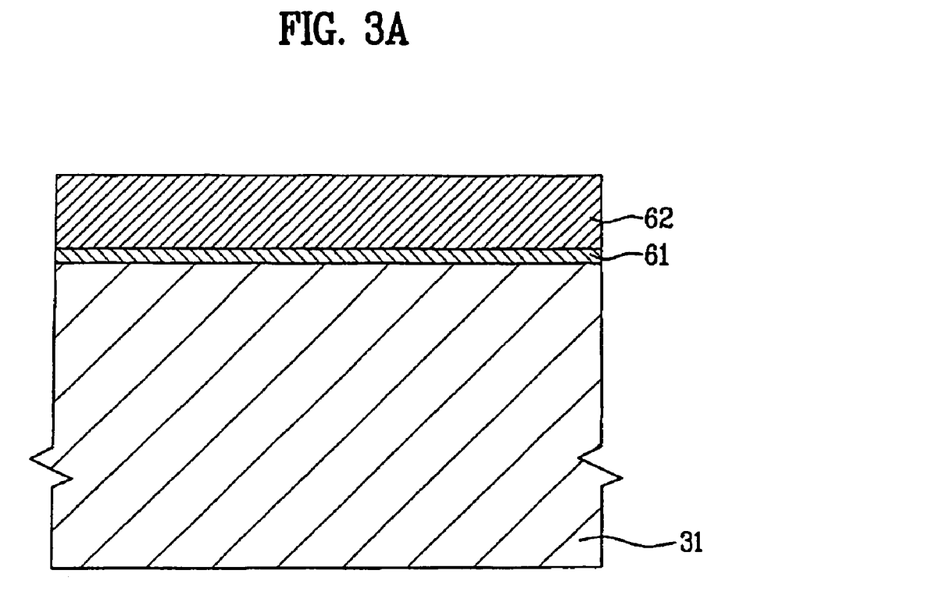
FIG. 3A to 3P illustrate cross-sectional views showing a method for fabricating a semiconductor device in accordance with the present invention.

Hereinafter, the method for fabricating the semiconductor device in accordance with the present invention will be described. As illustrated in FIG. 3A, first of all, a sacrificial oxide film 61 having thickness of, for example, 120 Å-170 Å is provided on a front surface of the semiconductor substrate 31 such as a height determining silicon, by carrying out a series of high temperature oxidation processes.

In this case, the sacrificing oxide film 61 performs a role of easing stress of the semiconductor substrate 31, the stress applied from the sacrificing nitride film 62 formed later.

Subsequently, a sacrificing nitride film 62 having thickness of, for example, about 2000 Å through 5000 Å is formed at an upper part of the sacrificing oxide film 61 by carrying out a series of low pressure chemical vapor deposition processes.

In this case, the sacrificing nitride film 62 serves as a mask layer during formation of the trench 41 and also performs a role as an etch-stopping film during a chemical-mechanical polishing process.

Figure 3B:
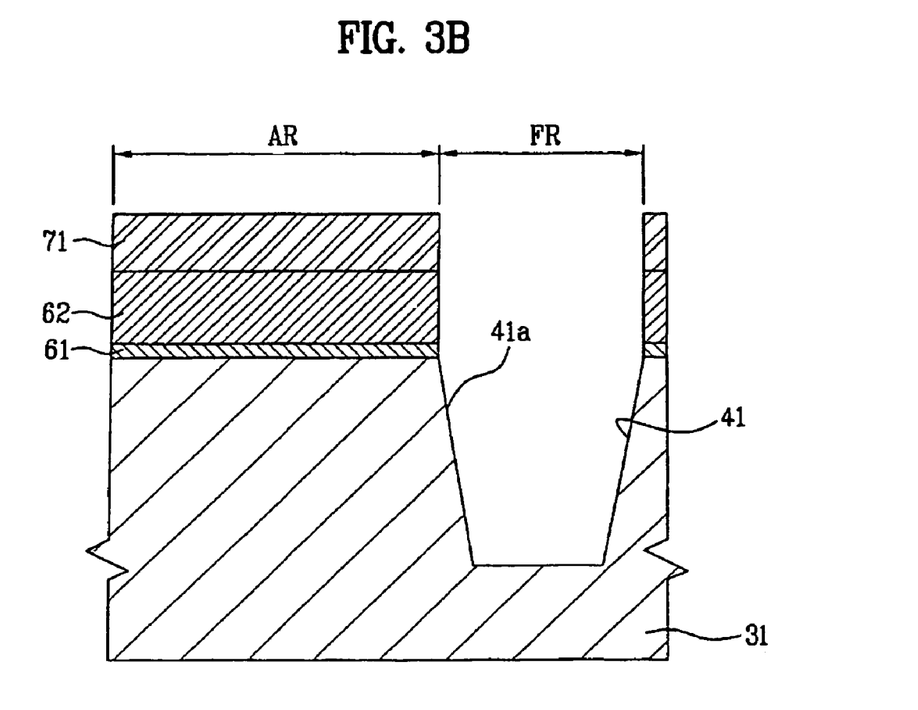

Then, as illustrated in FIG. 3B, a sensitive film pattern 71 is formed on the sacrificial nitride film 62 such that an opening of the sensitive film is positioned in the inactive region of the semiconductor substrate 31.

With the sensitive film pattern 71 serving as an etching mask, the sacrificial oxide film 61 and the sacrificial nitride film 62 are patterned by carrying out a dry etching process having an anisotropic characteristic, for example, a reactive ion etching process, such that the inactive region (FR) of the semiconductor substrate 31 is exposed. And then, the sensitive film pattern 71 is removed.

Subsequently, with sacrificial oxide film 61 and the sacrificial nitride film 62 serving as etching mask layers, the inactive region (FR) of the semiconductor substrate 31 being exposed is reactive ion etched, preferably, anisotropic etched to a depth of about 6000 Å through 12000 Å. In this way, the device isolating trench 41 is formed in the inactive region of the semiconductor substrate 11.

Figure 3C:
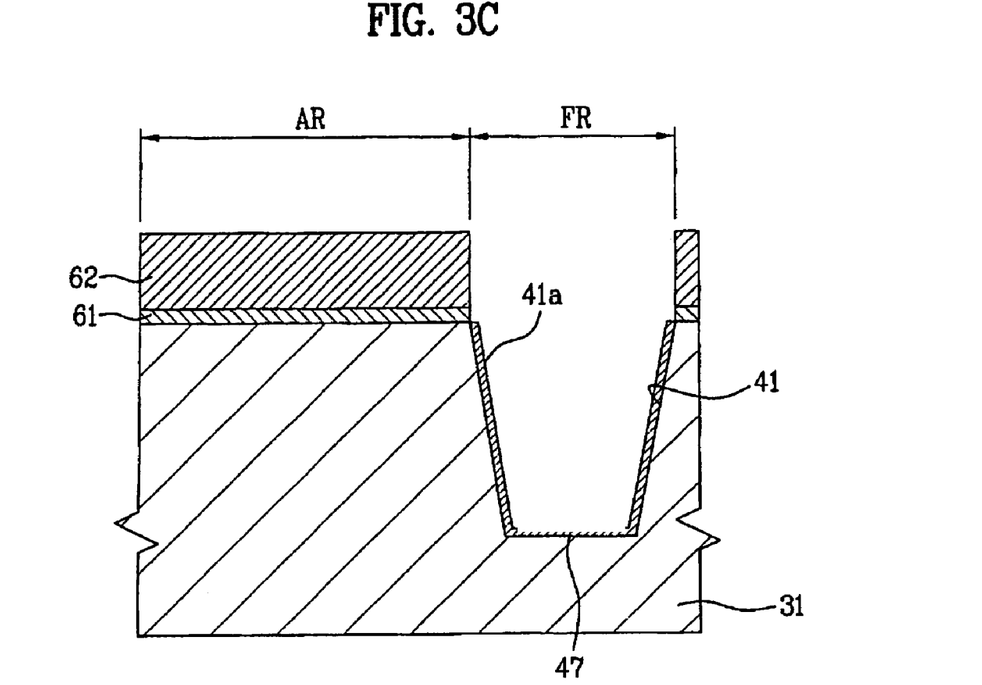

When a series of processes for forming a trench 16 is completed through the foregoing process, an etch termination discriminating film 47 is formed by carrying out, for example, a heat oxidation process of about 800° C. through 900° C., as illustrated in FIG. 3C, the etch termination discriminating film 47 covering an inner wall of the trench 41 of the semiconductor substrate 31 and having thickness of 100 Å through 400 Å, preferably.

Figure 3D:
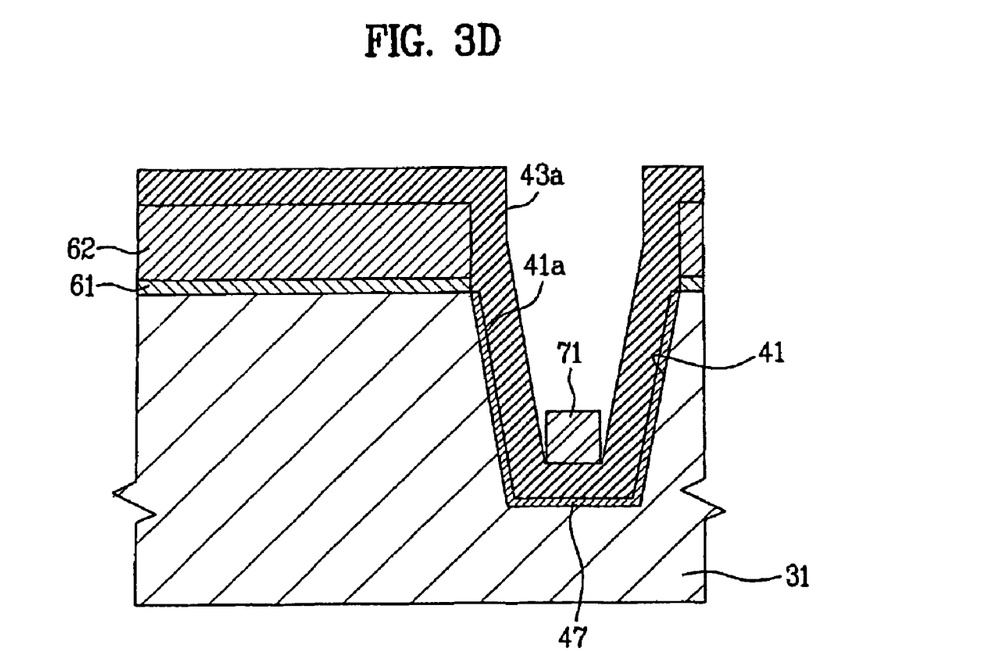

Subsequently, in the present invention, as illustrated in FIG. 3D, on the front surface of the semiconductor substrate 31 including the etch termination discriminating layer 47 in the sacrificing nitride film 62 and the trench 41, a poly silicon layer 43a is formed by carrying out a series of chemical vapor deposition processes, and a sensitive film pattern 71 covering the center of the bottom surface of the trench 41 is then formed at an upper part of the poly silicon layer 43a.

Figure 3E:
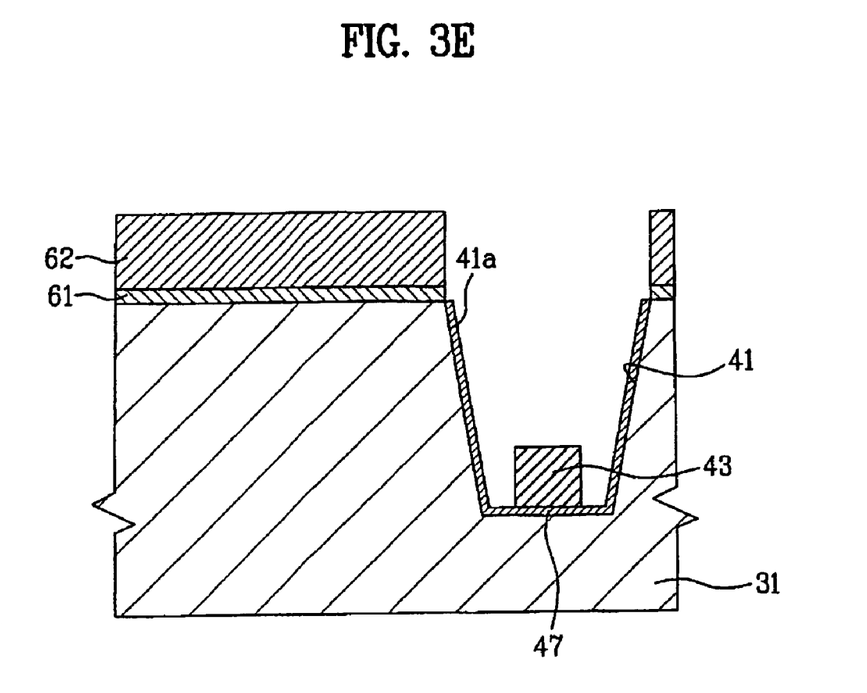

Subsequently, in the present invention, with the sensitive film pattern 71 as an etching mask, as illustrated in FIG. 3E, the first storage electrode pattern 43 is formed by carrying out a series of etching processes so as to remain the poly silicon layer 43a in the center of the bottom surface of the trench 41, the first storage electrode pattern 43 being formed on the bottom surface of the trench 41 and having a thickness of 2000 Å through 3000 Å, preferably.

In this case, the etch termination discriminating layer 47 disposed at a lower part of the first storage electrode pattern 43 includes a different material from the first storage electrode pattern, for example the oxidation material, such that the etch termination point of a corresponding first storage electrode pattern 47 is more easily discriminated.

Figure 3F:
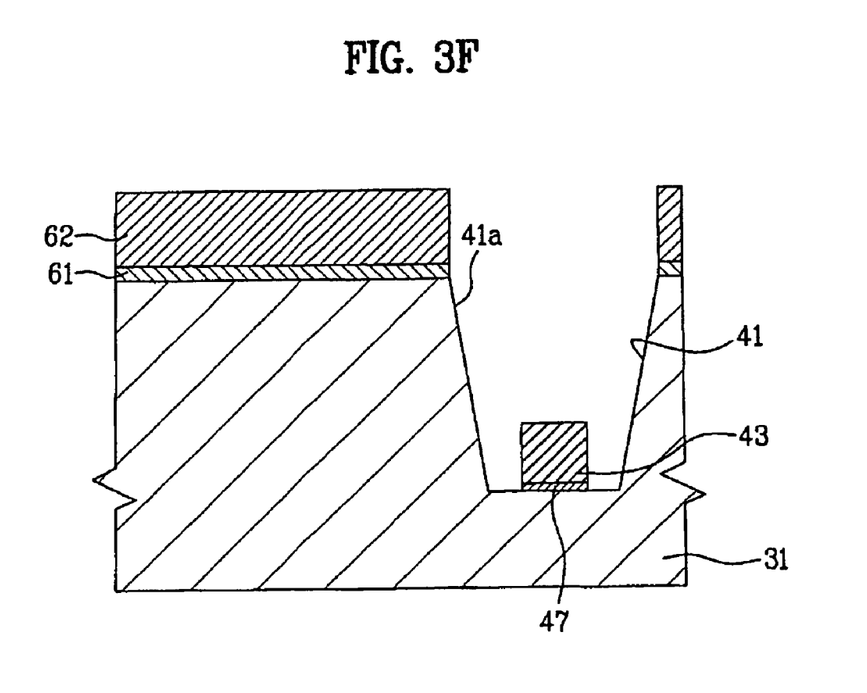

Subsequently, in the present invention, the etch termination discriminating layer 47 except a portion thereof, the portion formed on a lower part of the first storage electrode 43, is removed by carrying out, for example, a series of wet etch processes utilizing HF solution as illustrated in FIG. 3F. Accordingly, the etch surface 41a on the side of the active region of the trench 41 is exposed. The etch surface 41a on the side of the active region of the trench serves as a guide for an electric conductor to be formed later between the second storage electrode pattern 45 and a transistor 50 to be formed later.

Figure 3G:
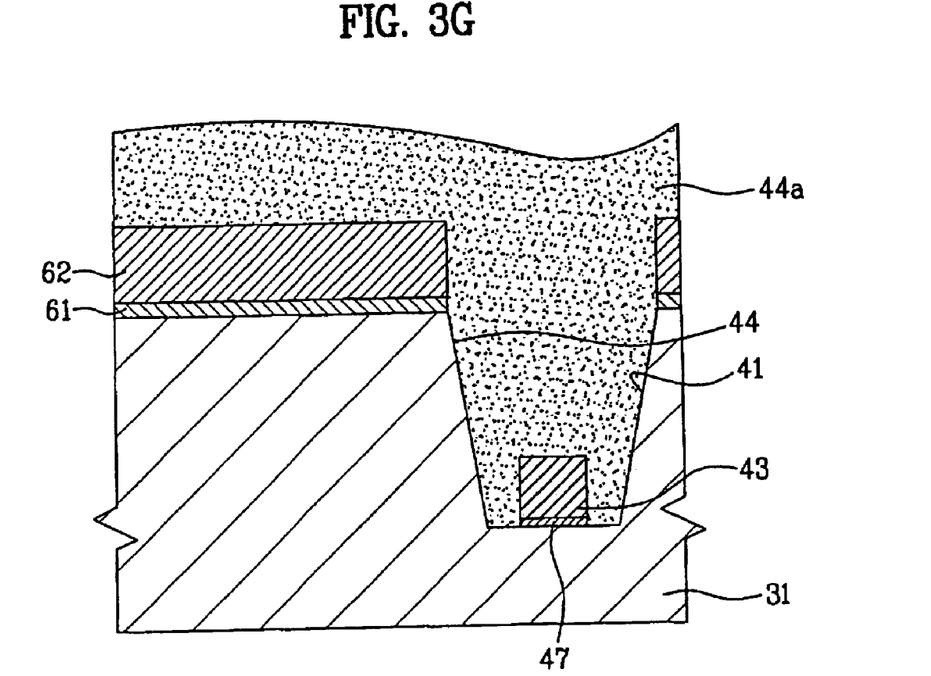

Through the foregoing process, when a series of formation processes of the first storage electrode pattern 43 is completed, in the present invention, an inside area of the trench 41 is filled in with an insulating film 44a, e.g., an oxide film, which is thick enough to cover the sacrificial nitride film 62, by selectively carrying out, for example, Tetra Ortho Silicate Glass (ozone-TEOS) process, Atmospheric Pressure Chemical Vapor Deposition process, plasma chemical vapor deposition process, and high density plasma chemical vapor deposition process, as illustrated in FIG. 3G. Then the insulating film 44a is planarized to the sacrificial nitride film 62 by carrying out a series of chemical-mechanical polishing processes utilizing the sacrificial nitride film 62 as the etch stop film.

Figure 3H:
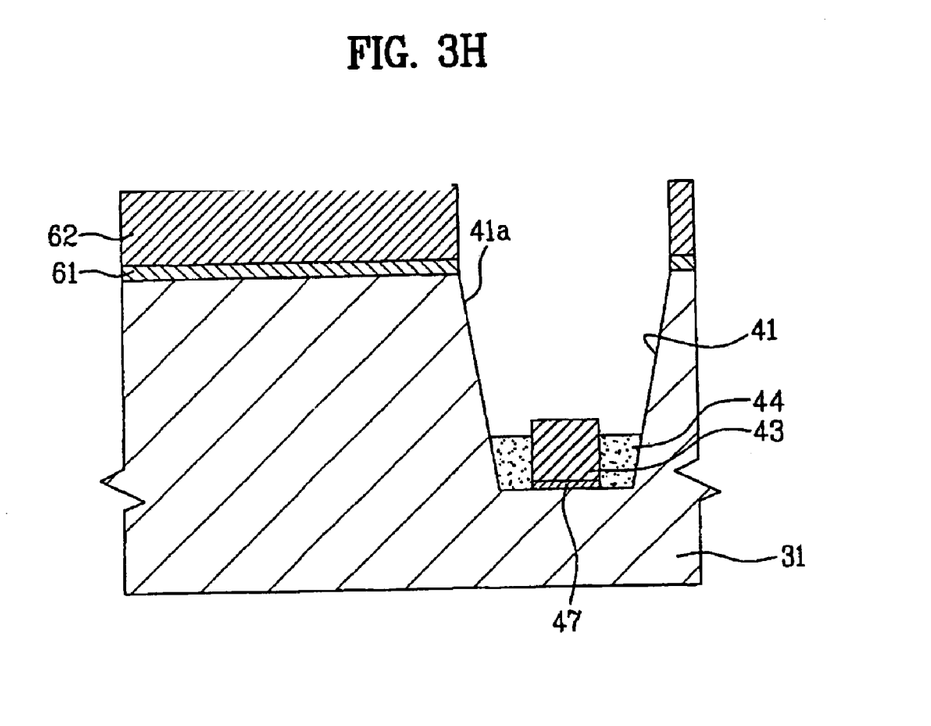

Subsequently, in the present invention, with the planarized insulating film 44a as a target, as illustrated in FIG. 3H, the storage dielectric film 44 is formed by carrying out a series of etch-back processes so as to fill in the lower space of the trench 41 while leaving a surface of the first storage electrode 43 as well as partial sides thereof exposed. In this case, the dielectric film 44 remains, preferably, 1800 Å through 2800 Å thick so as to partially cover sides of the storage electrode 43 by 50% up to 100%, as well as any valve therebetween.

Figure 3I:
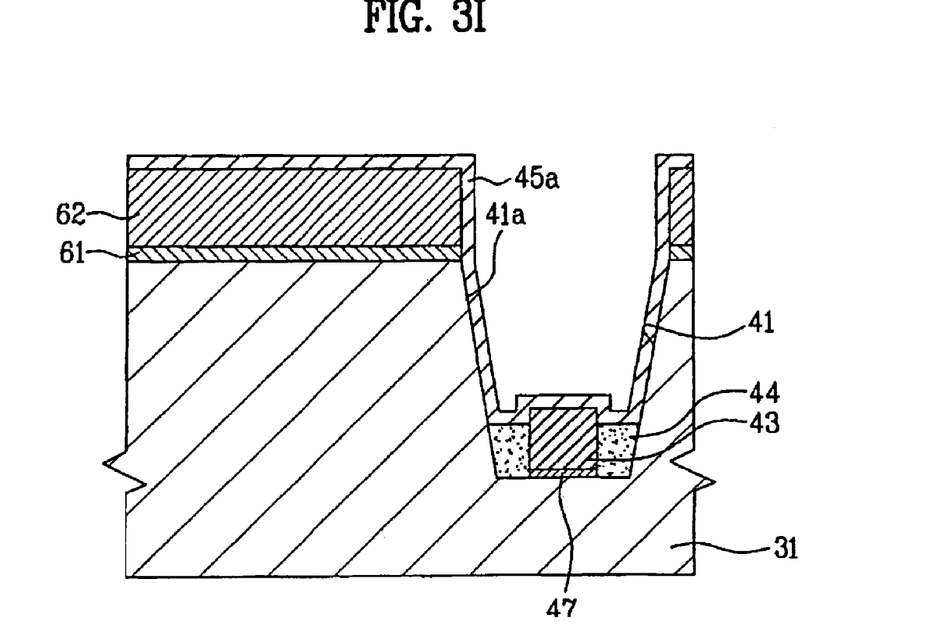
Figure 3J:
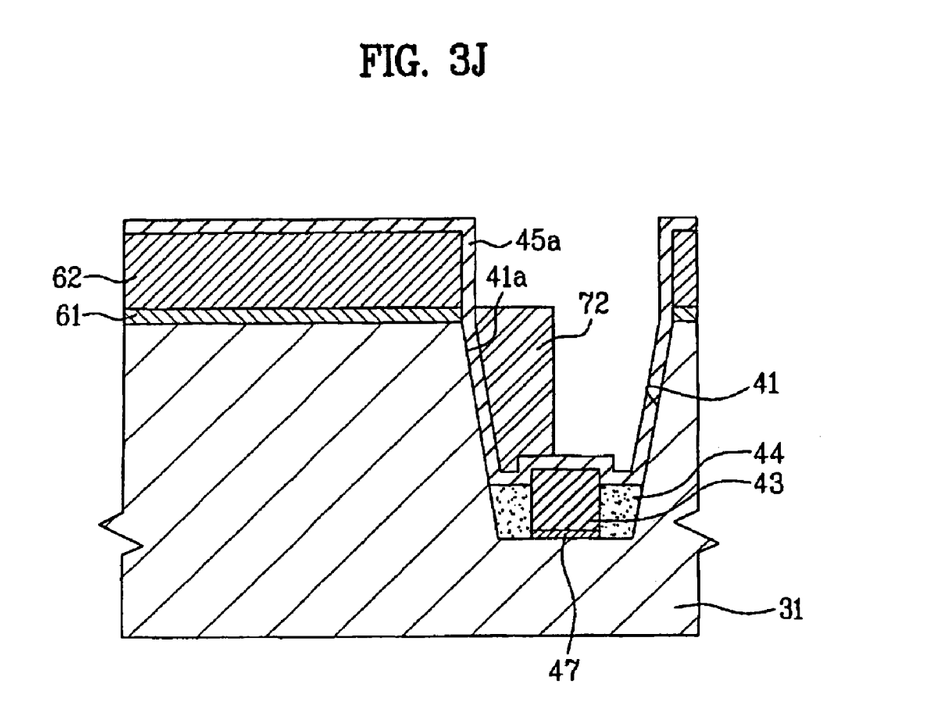

Subsequently, in the present invention, as illustrated in FIG. 3i, the poly silicon layer 45a is formed on the front surface of the semiconductor substrate 31 by carrying out a series of chemical vapor deposition processes, the semiconductor substrate 31 including the first storage electrode pattern 43 and the storage dielectric film 44. Then, as illustrated in FIG. 3J, a sensitive film pattern 72 is formed on an upper part of the poly silicon layer 45a, the sensitive film pattern 72 covering a portion of the active region of the trench 41.

Figure 3K:
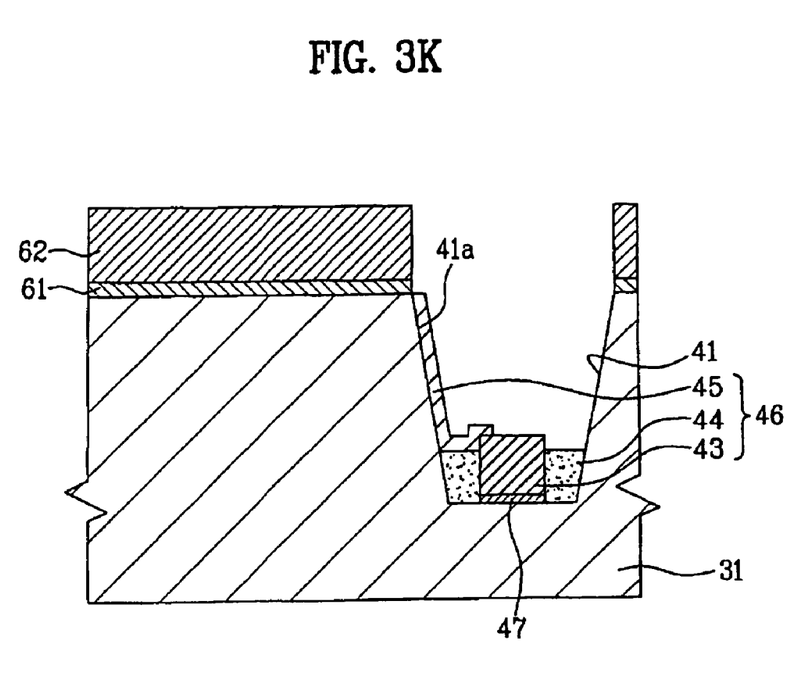

Subsequently, in the present invention, with the sensitive film pattern 72 as the etch mask, a second storage electrode pattern 45 is formed by carrying out a series of etching processes, the second storage electrode pattern 45 being disposed at an upper part of the storage dielectric film 44 and the first storage electrode pattern 43 and covering the etch surface 41a on the side of the active region of the trench 41, as illustrated in FIG. 3K.

In this case, the second storage electrode pattern 45 remains, preferably, 100 Å through 500 Å thick and is electrically connected with a transistor 50, e.g., a source/drain diffusion layer 54 of the transistor 50, which will be formed later, via the etch surface 41a on the side of the active region of the trench 41.

Figure 3L:
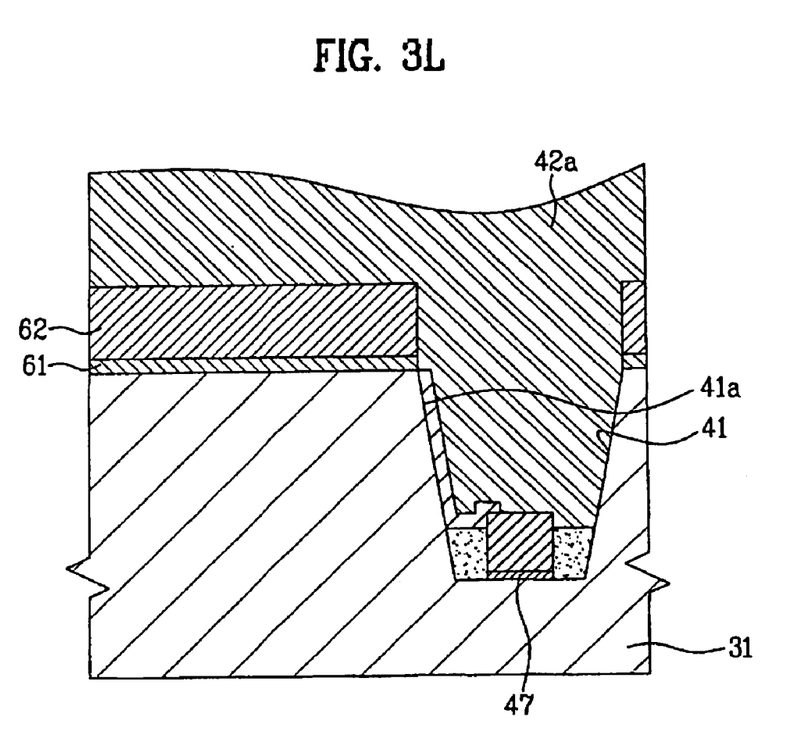
Figure 3M:
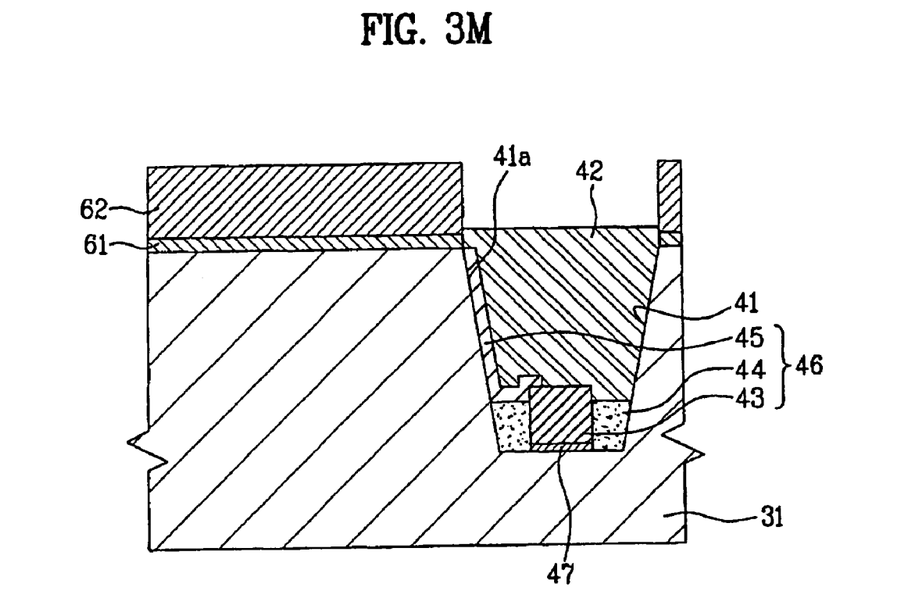

Through the foregoing process, when a series of processes for forming a capacitor 46 including the storage dielectric film 44, the first storage electrode pattern 43, and the second storage electrode pattern 45 is completed in the trench 41, in the present invention, an inside area of the trench 41 is filled in with an insulating film 42a, e.g., an oxide film, which is thick enough to cover the sacrificing nitride film 62, by selectively carrying out, for example, a Tetra Ortho Silicate Glass (ozone-TEOS) process, an atmospheric Pressure Chemical Vapor Deposition process, a plasma chemical vapor deposition process, and a high density plasma chemical vapor deposition process, as illustrated in FIG. 3L. Then, the insulating film 42a is planarized to a location of the sacrificial nitride film 62 by carrying out a series of chemical-mechanical polishing processes utilizing the sacrificial nitride film as the etch stop film, whereby the device separating film 42 is formed for filling in the rest space of the trench 41 as illustrated in FIG. 3M.

Figure 3N:
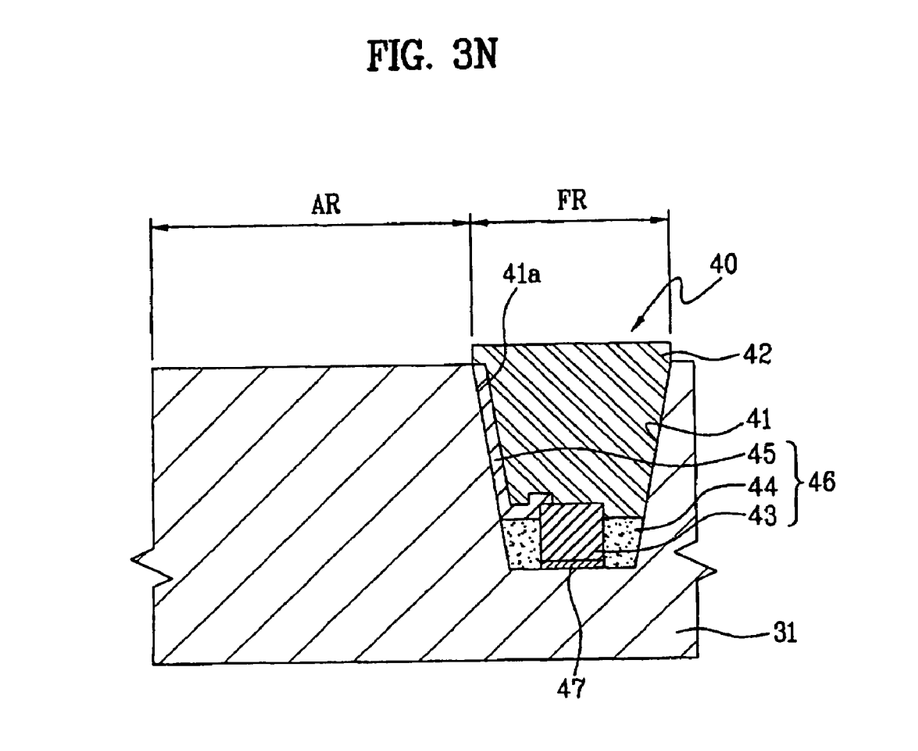

Subsequently, in the present invention, an isotropic etch of the sacrificial nitride film 62 is performed by carrying out a series of wet etch processes utilizing phosphoric acid. Then, as illustrated in FIG. 3N, the isotropic etch of the sacrificial oxide film 61 is performed by carrying out a series of wet etch processes using hydrofluoric acid solution, such that the active region (AR) of the semiconductor substrate 31 is exposed. Through this process, a series of processes for forming the device separator 40 is completed, the device separator 40 including the trench 41 formed by etching the semiconductor substrate 31 to a predetermined depth thereof, the capacitor 46 filling in a portion of the inside space of the trench 41, and the device separating film 42 filled in the remaining space of the trench 41 and performing a series of separating functions between the devices.

In this instance, although only one device separator 40 formed on the semiconductor substrate 31 is illustrated in the drawing in reality, it is apparent that a plurality of the device separators 40 are formed thereon for embodying the semiconductor device.

Figure 3O:
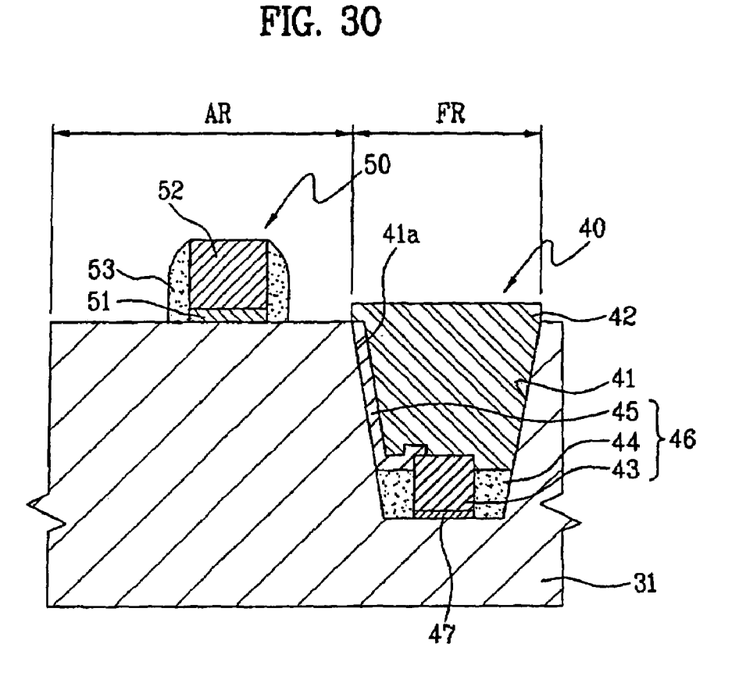

Through the foregoing process, when the formation of the device separator 40 for defining the active region (AR) of the semiconductor substrate 31 is completed, in the present invention, a gate insulating film is formed at an upper part of the active region (AR) of the semiconductor substrate 31 by carrying out a series of heat oxidation processes as illustrated in FIG. 3O, and a conductive layer of the gate electrode is sequentially formed at an upper part of the gate insulating film by carrying out a series of chemical vapor deposition processes. Then, through a series of picture etch processes, the gate insulating film, and the conductive layer of the gate electrode are patterned in whole, whereby the gate insulating film pattern 51 and the gate electrode pattern 52 are formed at an upper part of the active region (AR) of the semiconductor substrate 31 defined by the device separator 40.

In this instance, although only one gate electrode pattern 52 formed on the semiconductor substrate 31 is illustrated in the drawing, it is apparent that a plurality of gate electrode patterns 52 are formed thereon for the semiconductor device.

Subsequently, the oxide film and the nitride film on top of the semiconductor substrate 31 including the gate electrode pattern 52 are sequentially vapor deposited by carrying out a series of chemical vapor deposition processes, and a spacer 53 covering both sides of the gate electrode pattern 52 is then formed by etching the oxide film and the nitride film through a dry etch process e.g., a reactive ion etch process, the dry etch process potentially being a series of anisotropic etch processes.

Figure 3P:
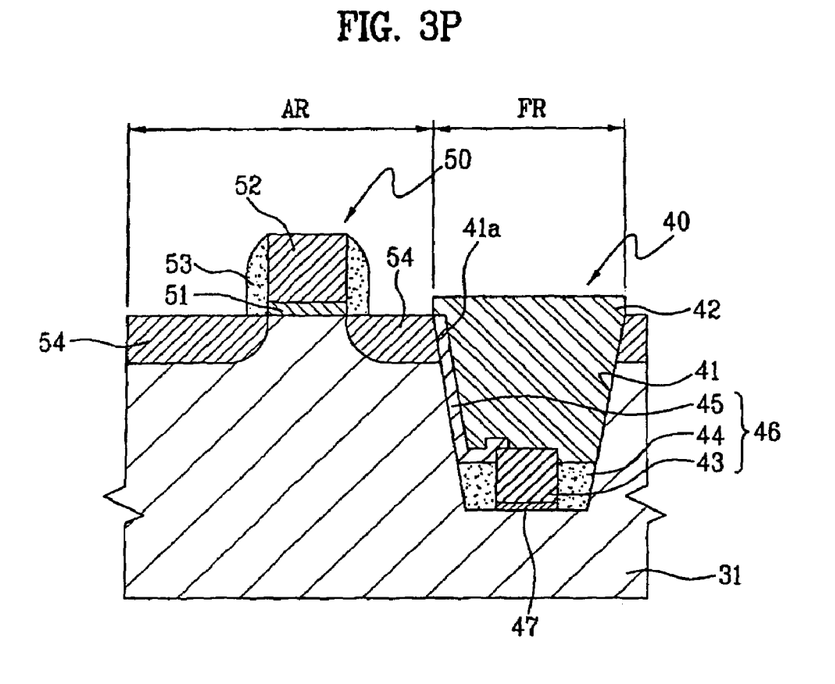

Subsequently, in the present invention, high density impurities are injected into the active region of the semiconductor substrate 31 by carrying out an ion implantation process using the spacer 53 as the ion implantation mask. Through the process, a source/drain diffusion layer 54 is formed on both sides of the gate electrode pattern 52 as illustrated in FIG. 3P.

In this case, as shown in the drawing, the source/drain diffusion layer 54 is electrically connected with the second storage electrode 45 of the capacitor 46 via the etch surface 41*a* on the side of the active region of the trench 41. In the end, in spite of being buried in the trench 41 of the device separator 40, the capacitor 46 is able to store the electric charge, as switched by the transistor 50.

Thereafter, in the present invention, fabrication of the semiconductor is finally completed by additionally performing processes of forming the inter layer insulating film, forming a contact hole, forming a metal wiring, and the like.

Figure 4:
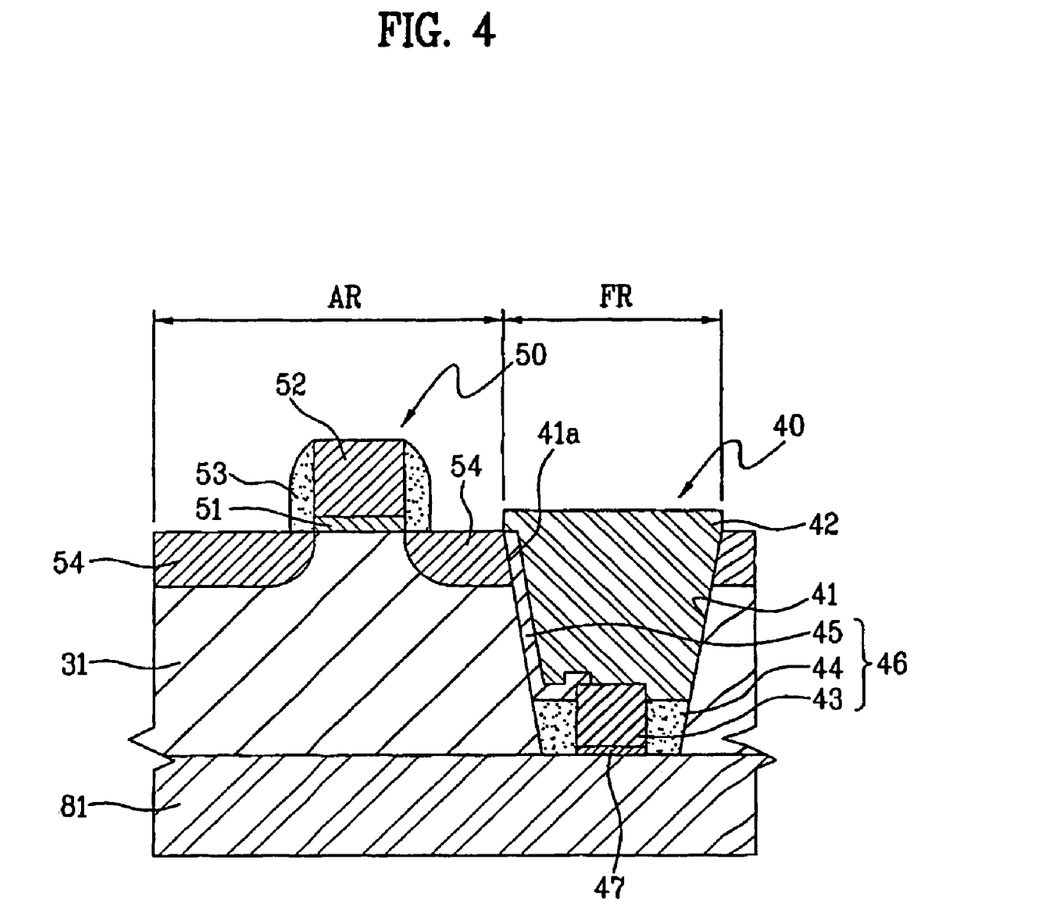
FIG. 4 illustrates a cross-sectional view showing a semiconductor device in accordance with another embodiment of the present invention.

In the mean time, as described above, the present invention includes various modifications according to the circumstance. For example, as illustrated in FIG. 4, the device separator 40 in accordance with the present invention may be disposed on a Silicon-On-Insulator substrate (SOI substrate) having a buried oxide film 81 being in contact with the trench 41. In this case, a finished semiconductor device more easily achieves effects of improvement in device separation efficiency and in reduction of parasitic capacitance.

In this instance, as illustrates in the drawing, contrary to the foregoing embodiment, the etch termination discriminating layer 47 is not separately formed at a lower part of the first storage electrode pattern 43 because, when a bottom surface of the trench 41 including a base of the first storage electrode pattern 43 is in direct contact with the buried oxide film 81 made of a material which is totally different from that of the first storage electrode pattern 43, the etch termination point of the first storage electrode pattern 43 is easily discriminated without the etch termination discriminating layer formed separately.

In this case, since the capacitor 46 formed in the active region (AR) of a conventional semiconductor substrate is of course transferred to the inside of the inactive region of the semiconductor substrate, i.e., to the device isolating trench 41 and thereby formed therein, the active region (AR) of the semiconductor device of the present invention is decreased to a minimum size, whereby the final semiconductor device is able to support the high integration demands of recent years.

As described in the description, the storage electrode film and the storage electrode included in the capacitor in accordance with the present invention are transferred from the active region of the semiconductor substrate to an inactive region thereof, e.g., into the device separating trench such that the capacitor is induced not to occupy the active region of the semiconductor substrate unnecessarily while maintaining its proper function.

Accordingly, because the capacitor is maintained in the trench structure, a step of removing of a step height difference is not needed, and the active region thereof is minimized in size.

This application claims the benefit of Korean patent Application No. P2003-00710, filed on Dec. 30, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device, comprising the steps of:
   forming a trench having a predetermined depth by etching an inactive region of the semiconductor substrate so as to divide the device into an active region and the inactive region;
   forming a first storage electrode pattern on a bottom surface of the trench;
   filling a lower space of the trench with a storage dielectric film such that a surface of the first storage electrode pattern is exposed but at least a portion of sides of the first storage electrode pattern are covered by the storage dielectric film;
   forming a second storage electrode pattern at an upper part of the storage dielectric film and the first storage electrode pattern, the second storage electrode pattern covering an etch surface on an active region side of the trench and configured to electrically connect the first storage electrode pattern with a transistor;
   filling a remaining space of the trench with a device separating film; and
   forming a transistor in the active region of the semiconductor substrate so as to be electrically connected with the second storage electrode pattern via the etch surface on the side of the active region of the trench.

2. The method of claim 1 further comprising the step of forming an etch termination discriminating layer on the etch surface of the trench prior to the step of forming the first storage electrode pattern.

3. The method of claim 2, wherein the step of forming the etch termination discriminating layer includes using a heat oxidation process.

4. The method of claim 1, wherein step of forming the trench includes etching the semiconductor substrate to a depth in an inclusive range of 6000 Å through 12000 Å.

5. The method of claim 1, wherein the step of filling a lower space of the trench includes forming the storage dielectric film by chemical vapor deposition.

6. The method of claim 1, wherein the step of filling a lower space of the trench includes forming the storage dielectric film to be 1800 Å through 2800 Å thick.

7. The method of claim 1, wherein the first and second storage electrode films include poly silicon.

8. The method of claim 1, wherein the first storage electrode pattern is 2000 Å through 3000 Å thick.

9. The method of claim 1, wherein the second storage electrode pattern is 100 Å through 500 Å thick.

10. The method of claim 1, wherein said filling a lower space includes covering at least 50% of the sides of the first storage electrode with the storage dielectric film.

11. The method of claim 10, wherein the covering step includes covering at least 90% of the sides of the first storage electrode with the storage dielectric film.

12. The method of claim 1, wherein the covering step includes covering substantially all of the sides of the first storage electrode, but not a upper surface thereof.

13. A method for fabricating a semiconductor device, comprising the steps for:
forming a trench having a predetermined depth by etching an inactive region of the semiconductor substrate so as to divide the device into an active region and the inactive region;
forming a first storage electrode pattern on a bottom surface of the trench;
filling a lower space of the trench with a storage dielectric film after formation of the first storage electrode pattern such that a surface of the first storage electrode pattern is exposed but at least a portion of sides of the first storage electrode pattern are covered by the storage dielectric film;
forming a second storage electrode pattern at an upper part of the storage dielectric film and the first storage electrode pattern, the second storage electrode pattern covering an etch surface that extends from the upper part of the storage dielectric film along an active region side of the trench and configured to electrically connect the first storage electrode pattern with a transistor;
filling a remaining space of the trench with a device separating film; and
forming a transistor in the active region of the semiconductor substrate so that is electrically connected with the second storage electrode pattern via the etch surface on the side of the active region of the trench.

* * * * *